(12) United States Patent
Truong et al.

(10) Patent No.: US 8,264,907 B2
(45) Date of Patent: Sep. 11, 2012

(54) METHOD OF INCREASING A TIMING MARGIN FOR WRITING DATA TO A MEMORY ARRAY

(75) Inventors: Phat Truong, Houston, TX (US); Tien Dinh Le, Sugar Land, TX (US)

(73) Assignee: Nanya Technology Corp., Tao-Yuan Hsien (TW)

( * ) Notice: Subject to any disclaimer, the term of this patent is extended or adjusted under 35 U.S.C. 154(b) by 391 days.

(21) Appl. No.: 12/578,917

(22) Filed: Oct. 14, 2009

(65) Prior Publication Data

US 2011/0085392 A1   Apr. 14, 2011

(51) Int. Cl.
*G11C 8/18* (2006.01)
(52) U.S. Cl. ......... 365/233.13; 365/233.12; 365/233.16; 365/233.1; 365/193; 365/194
(58) Field of Classification Search ............ 365/233.11, 365/233.12, 233.13, 233.16, 233.1, 193, 365/194, 191
See application file for complete search history.

(56) References Cited

U.S. PATENT DOCUMENTS

| | | | |
|---|---|---|---|
| 7,457,174 B2 * | 11/2008 | Braun et al. | 365/193 |
| 2008/0144405 A1 * | 6/2008 | Teh et al. | 365/193 |
| 2011/0085392 A1 * | 4/2011 | Truong et al. | 365/193 |

* cited by examiner

*Primary Examiner* — Andrew Q Tran
(74) *Attorney, Agent, or Firm* — Volpe and Koenig, P.C.

(57) ABSTRACT

A method is provided for writing data to a memory array operating in synchronization with a clock signal having a transition edge. A data strobe signal having a transition edge corresponding to the transition edge of the clock signal is provided. The transition edge of the clock signal is used to relay the data corresponding to the transition edge of the data strobe signal if the transition edge of the data strobe signal is coming in earlier than the transition edge of the clock signal, wherein the clock signal has a rising edge and a falling edge, the data strobe signal has a rising edge and a falling edge respectively corresponding to the rising and the falling edges of the clock signal, and the transition edge of the clock signal is one of the rising and the falling edges of the clock signal.

17 Claims, 4 Drawing Sheets

METHOD OF INCREASING A TIMING MARGIN FOR WRITING DATA TO A MEMORY ARRAY

FIELD OF THE INVENTION

The present invention relates to a method for writing data to a memory array, and more particularly to a method to increase a timing margin for writing data to a memory array.

BACKGROUND OF THE INVENTION

Please refer to FIG. 1, which is the schematic diagram showing the first conventional scheme for writing the data DR1 to the double data rate synchronous dynamic random access memory (DDR SDRAM) array 101. FIG. 1 shows a memory device 10 and waveforms including the clock signal CLK1, the data strobe signal DQS1, the data bus signal DQ1 and the signal DAR11. The memory device 10 receives the clock signal CLK1, the data strobe signal DQS1 and the data bus signal DQ1, and includes the DDR SDRAM array 101 operating in synchronization with the clock signal CLK1. The clock signal CLK1 has the rising edge RC11 and the rising edge RC12 lagged behind the rising edge RC11 by one clock cycle of the clock signal CLK1. The data bus signal DQ1 includes the data DR1.

Based on DDR/DDR2/DDR3 JEDEC timing specification, both the data DR1 and the rising edge of the data strobe signal DQS1 corresponding to the rising edge RC12 can arrive at the memory device 10 anytime between ¼ clock cycle before and ¼ clock cycle after the rising edge RC12. The data DR1 is provided to the memory device 10 on the rising edge of the data strobe signal DQS1 corresponding to the rising edge RC12. If the data strobe signal DQS1 is coming in the memory device 10 later than the clock signal CLK1, the data strobe signal DQS1 is shown to be the signal DQS11 and the data DR1 is shown to be the data DR1L. If the data strobe signal DQS1 is coming in the memory device 10 earlier than the clock signal CLK1, the data strobe signal DQS1 is shown to be the signal DQS12 and the data DR1 is shown to be the data DR1E.

The signal DQS11 includes the rising edge RDL11 corresponding to the rising edge RC12. The signal DQS12 includes the rising edge RDE11 corresponding to the rising edge RC12. The rising edges RDL11 and RDE11 are coming in later and earlier respectively than the rising edge RC12. The rising edges RDL11 and RDE11 respectively correspond to the data DR in duration HR1L and the data DR1E in duration HR1E, and are used to respectively capture the data DR and the data DR1E.

The signal DAR11 is produced in response to the data strobe signal DQS1 and the data bus signal DQ1. The data DR1 of the data bus signal DQ1 is latched into the signal DAR11 at a first time point lagged behind the rising edge of the data strobe signal DQS1, corresponding to the rising edge RC12, by a first time interval until a second time point in response to the rising edge of the data strobe signal DQS1 corresponding to the rising edge RC12.

As shown in FIG. 1, the data DR1 and the rising edge RDL11 arrive at the memory device 10 at a time point of ¼ clock cycle after the rising edge RC12. The rising edge RDL11 is used to capture the data DR1L, and the data DR1L is latched into the signal DAR11 at the time point TR11 lagged behind the rising edge RDL11 by the time interval GR1 until the time point TR12 in response to the rising edge RDL11. The time intervals GR1 is a propagation delay from the rising edge RDL11 to output the data DR1L-RDL11 of a flip-flop or a latch (not shown) being used to capture the data DR1L. The time point TR11 and the time point TR12 have the duration HR11 being one clock cycle of the clock signal CLK1.

As shown in FIG. 1, the data DR1E and the rising edge RDE11 arrive at the memory device 10 at a time point of ¼ clock cycle before the rising edge RC12. The rising edge RDE11 is used to capture the data DR1E, and the data DR is latched into the signal DAR 11 at the time point TR21 lagged behind the rising edge RDE11 by the time interval GR2 until the time point TR22 in response to the rising edge RDE11. The time intervals GR2 is a propagation delay from the rising edge RDE11 to output the data DR1E-RDE11 of the flip-flop or the latch being used to capture the data DR1E. The time point TR21 and the time point TR22 have the duration HR12 being one clock cycle of the clock signal CLK1. For instance, the time intervals GR1 and GR2 have a same time length.

The internal clock signal ICLK1 is produced, e.g. by an input buffer (not shown) in the memory device 10, in response to the clock signal CLK1, and is provided to the inside of the memory device 10. The data valid window QR1 of the data DR1, seen by the internal clock ICLK1, is a time interval between the time point TR11 and the time point TR22. Therefore, the data valid window QR1 is only a ½ clock cycle of the clock signal CLK1.

Please refer to FIG. 2, which is the schematic diagram showing the second conventional scheme for writing the data DF1 to the double data rate synchronous dynamic random access memory (DDR SDRAM) array 101. FIG. 2 shows waveforms including the clock signal CLK1, the data strobe signal DQS1, the data bus signal DQ1 and the signal DAF11. The clock signal CLK1 has the falling edge FC11 and the falling edge FC12 lagged behind the falling edge FC11 by one clock cycle of the clock signal CLK1. The data bus signal DQ1 includes the data DF1.

Based on DDR/DDR2/DDR3 JEDEC timing specification, both the data DF1 and the falling edge of the data strobe signal DQS1 corresponding to the falling edge FC12 can arrive at the memory device 10 anytime between ¼ clock cycle before and ¼ clock cycle after the falling edge FC12. The data DF1 is provided to the memory device 10 on the falling edge of the data strobe signal DQS1 corresponding to the falling edge FC12. If the data strobe signal DQS1 is coming in the memory device 10 later than the clock signal CLK1, the data strobe signal DQS1 is shown to be the signal DQS11 and the data DF1 is shown to be the data DF1L. If the data strobe signal DQS1 is coming in the memory device 10 earlier than the clock signal CLK1, the data strobe signal DQS1 is shown to be the signal DQS12 and the data DF1 is shown to be the data DF1E.

The signal DQS11 includes the falling edge FDL11 corresponding to the falling edge FC12. The signal DQS12 includes the falling edge FDE11 corresponding to the falling edge FC12. The falling edges FDL11 and FDE11 are coming in later and earlier respectively than the falling edge FC12. The falling edges FDL11 and FDE11 respectively correspond to the data DF1L in duration HF1L and the data DF1E in duration HF1E, and are used to respectively capture the data DF1L and the data DF1E.

The signal DAF11 is produced in response to the data strobe signal DQS1 and the data bus signal DQ1. The data DF1 of the data bus signal DQ1 is latched into the signal DAF11 at a third time point lagged behind the falling edge of the data strobe signal DQS1, corresponding to the falling edge FC12, by a second time interval until a fourth time point in response to the falling edge of the data strobe signal DQS1 corresponding to the falling edge FC12.

As shown in FIG. 2, the data DF1 and the falling edge FDL11 arrive at the memory device 10 at a time point of ¼ clock cycle after the falling edge FC12. The falling edge FDL11 is used to capture the data DF1L, and the data DF1L is latched into the signal DAF11 at the time point TF11 lagged behind the falling edge FDL11 by the time interval GF1 until the time point TF12 in response to the falling edge FDL11. The time intervals GF1 is a propagation delay from the falling edge FDL11 to output the data DF1L-FDL11 of a flip-flop or a latch (not shown) being used to capture the data DF1L. The time point TF11 and the time point TF12 have the duration HF11 being one clock cycle of the clock signal CLK1.

As shown in FIG. 2, the data DF and the falling edge FDE11 arrive at the memory device 10 at a time point of ¼ clock cycle before the falling edge FC12. The falling edge FDE11 is used to capture the data DF1E, and the data DF is latched into the signal DAF11 at the time point TF21 lagged behind the falling edge FDE11 by the time interval GF2 until the time point TF22 in response to the falling edge FDE11. The time intervals GF2 is a propagation delay from the falling edge FDE11 to output the data DF1E-FDE11 of the flip-flop or the latch being used to capture the data DF1E. The time point TF21 and the time point TF22 have the duration HF12 being one clock cycle of the clock signal CLK1. For instance, the time intervals GF1 and GF2 have a same time length. The data valid window QF1 of the data DF1, seen by the internal clock ICLK1, is a time interval between the time point TF11 and the time point TF22. Therefore, the data valid window QF1 is only a ½ clock cycle of the clock signal CLK1.

Because the data valid windows QR1 and QF1 for writing the data DR1 and the data DF1 to the DDR SDRAM array 101 are small, capturing the data DR1 and the data DF1 properly can be difficult especially with wide process, temperature and voltage variations, so that it is very difficult to meet JEDEC DQS and Data timing requirement.

SUMMARY OF THE INVENTION

It is an object of the present invention to provide a method to increase timing margin for writing data to a memory array when the clock domain of the data strobe signal is crossed to the internal clock domain.

It is therefore a first aspect of the present invention to provide a method for writing data to a memory array operating in synchronization with a clock signal having a transition edge. The method includes the following steps. A data strobe signal having a transition edge corresponding to the transition edge of the clock signal is provided. The transition edge of the clock signal is used to relay the data corresponding to the transition edge of the data strobe signal if the transition edge of the data strobe signal is coming in earlier than the transition edge of the clock signal, wherein the clock signal has a rising edge and a falling edge, the data strobe signal has a rising edge and a falling edge respectively corresponding to the rising and the falling edges of the clock signal, and the transition edge of the clock signal is one of the rising and the falling edges of the clock signal.

It is therefore a second aspect of the present invention to provide a method for writing data to a memory array operating in synchronization with a clock signal having a transition edge. The method includes the following steps. A data strobe signal having a transition edge corresponding to the transition edge of the clock signal is provided. The transition edge of the clock signal is used to relay the data corresponding to the transition edge of the data strobe signal if the transition edge of the data strobe signal is coming in earlier than the transition edge of the clock signal.

It is therefore a third aspect of the present invention to provide a method for writing data to a memory. The method includes the following steps. A clock signal is provided. A data strobe signal is received. The data is relayed based on the clock signal if the data strobe signal is coming in earlier than the clock signal.

BRIEF DESCRIPTION OF THE DRAWINGS

The foregoing and other features and advantages of the present invention will be more clearly understood through the following descriptions with reference to the drawings, wherein.

DETAIL DESCRIPTION OF THE PREFERRED EMBODIMENT

The present invention will now be described more specifically with reference to the following embodiments. It is to be noted that the following descriptions of preferred embodiments of this invention are presented herein for the purposes of illustration and description only; it is not intended to be exhaustive or to be limited to the precise form disclosed.

Figure 3:
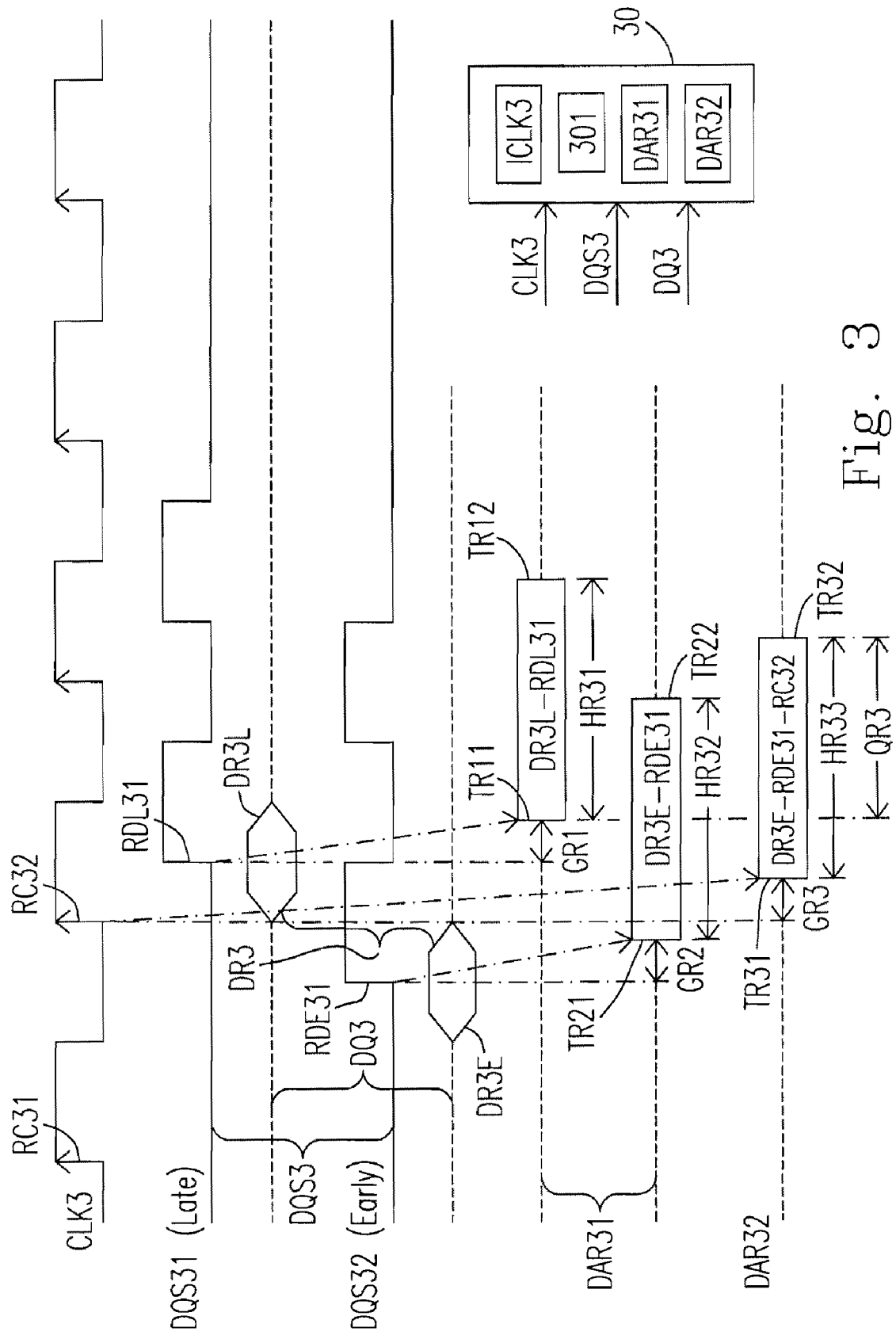
FIG. 3 is a schematic diagram showing a scheme for writing data to a memory array according to the first embodiment of the present invention.

Please refer to FIG. 3, which is the schematic diagram showing the scheme for writing the data DR3 to the memory array 301 according to the first embodiment of the present invention. FIG. 3 shows a memory device 30 and waveforms including the clock signal CLK3, the data strobe signal DQS3, the data bus signal DQ3, the signal DAR31, and the signal DAR32. The memory device 30 receives the clock signal CLK3, the data strobe signal DQS3 and the data bus signal DQ3, and includes the memory array 301 operating in synchronization with the clock signal CLK3. The memory array 301 may be a DRAM array, e.g. a DDR SDRAM array.

Figure 1:
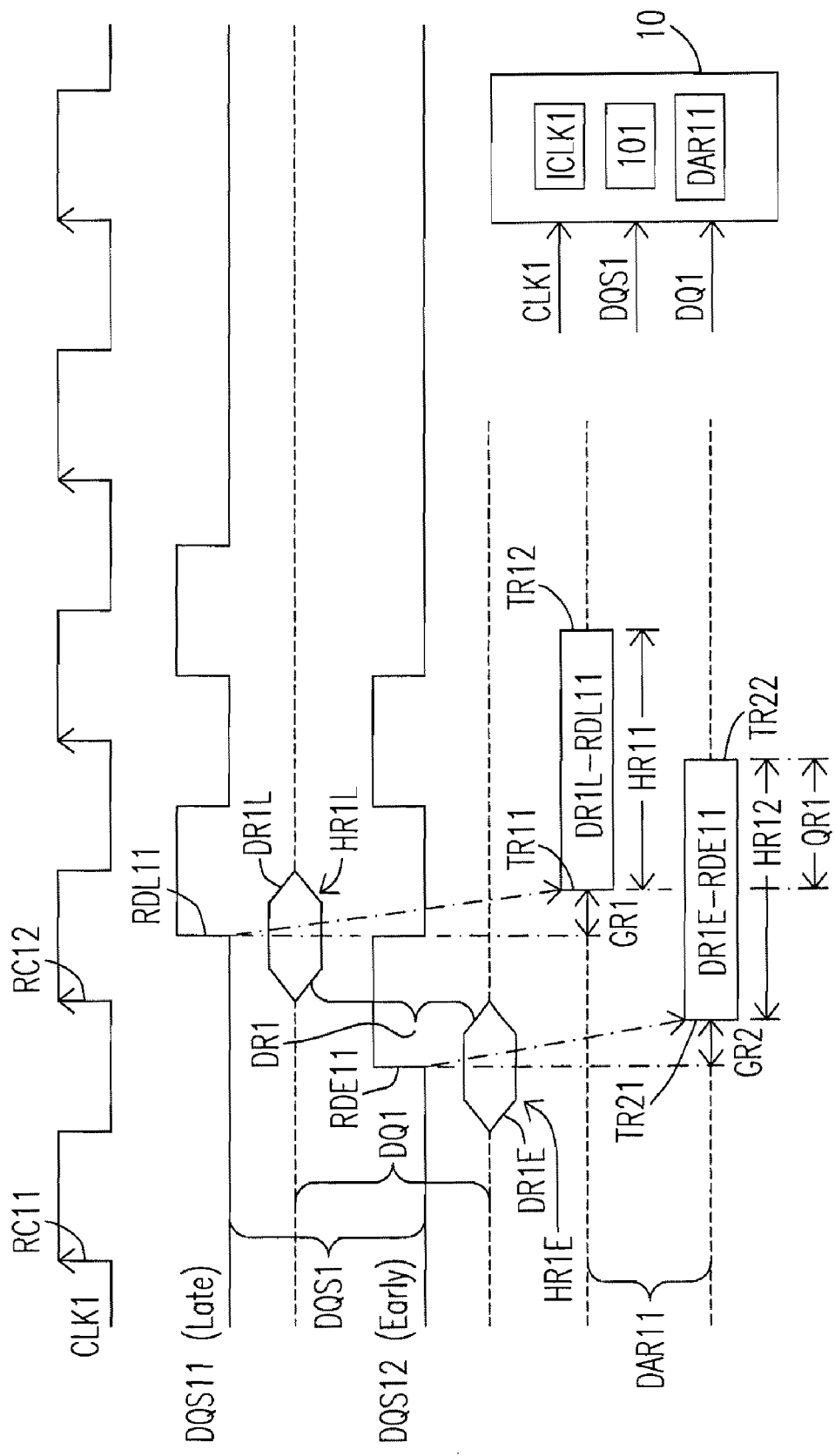
FIG. 1 is a schematic diagram showing the first conventional scheme for writing data to a DDR SDRAM array.

Comparing the embodiment in FIG. 3 with the conventional scheme in FIG. 1, most functions and operation principles of the schemes are similar or the same, so that the descriptions for the portion of the same or the similar are omitted, wherein the memory device 30, the memory array 301, the clock signal CLK3, the rising edge RC31, the rising edge RC32, the data strobe signal DQS3, the signal DQS31, the rising edge RDL31, the signal DQS32, the rising edge RDE31, the data bus signal DQ3, the data DR3, the data DR3L, the data DR3E, the signal DAR31, the data DR3L-RDL31, the time interval GR1, the time point TR11, the time point TR12, the duration HR31, the data DR3E-RDE31, the time interval GR2, the time point TR21, the time point TR22, the duration HR32 and the internal clock ICLK3 in FIG. 3 correspond to the memory device 10, the DDR SDRAM array 101, the clock signal CLK1, the rising edge RC11, the rising edge RC12, the data strobe signal DQS1, the signal DQS11, the rising edge RDL11, the signal DQS12, the rising edge RDE11, the data bus signal DQ1, the data DR1, the data DR1L, the data DR1E, the signal DAR 11, the data DR1L-RDL11, the time interval GR1, the time point TR11, the time point TR12, the duration HR11, the data DR1E-RDE11, the time interval GR2, the time point TR21, the time point TR22, the duration HR12 and the internal clock ICLK1 in FIG. 1, respectively.

In an embodiment in FIG. 3, the data strobe signal DQS3 has a specific rising edge, e.g. RDL31 or RDE31, corresponding to the rising edge RC32 of the clock signal CLK3. The rising edge RC32 is used to relay the data DR3 corresponding to the specific rising edge, e.g. RDE31, of the data strobe signal DQS3 if the specific rising edge, e.g. RDE31, of the data strobe signal DQS3 is coming in earlier than the rising edge RC32 of the clock signal CLK3. In an embodiment, whether the specific rising edge, e.g. RDL31 or RDE31, of the data strobe signal DQS3 is coming in earlier than the rising edge RC32 is detected before the rising edge RC32 is used to relay the data DR3 to the memory array 301.

Based on DDR/DDR2/DDR3 JEDEC timing specification, the rising edge RC32 and the specific rising edge, e.g. RDL31 or RDE31, of the data strobe signal DQS3 have a first timing difference in a range from −25% to 25% of one clock cycle of the clock signal CLK3. In an embodiment, the signal DAR31 is produced in response to the data strobe signal DQS3 and the data bus signal DQ3. The signal DAR32 is produced in response to the clock signal CLK1 and the signal DAR31. The data DR3 of the data bus signal DQ3 is latched into the signal DAR31 at a first time point lagged behind the specific rising edge, e.g. RDL31 or RDE31, of the data strobe signal DQS3 by a first time interval until a second time point in response to the specific rising edge, e.g. RDL31 or RDE31, of the data strobe signal DQS3.

For instance, when the first timing difference is 25% of one clock cycle of the clock signal, i.e., when the data strobe signal DQS3 is the signal DQS31, the data DR3, marked to be DR3L, of the data bus signal DQ3 is latched into the signal DAR31 at the time point TR11 lagged behind the rising edge RDL31 of the signal DQS31 by the time interval GR1 until the time point TR12 in response to the rising edge RDL31. The time interval GR1 may be a propagation delay used to capture the data DR3, marked to be DR3L, of the data bus signal DQ3 into the signal DAR31. For instance, when the specific rising edge of the data strobe signal DQS3 is coming in earlier than the rising edge RC32, i.e., when the data strobe signal DQS3 is the signal DQS32, the data DR3, marked to be DR3E, of the data bus signal DQ3 is latched into the signal DAR31 at the time point TR21 lagged behind the rising edge RDE31 of the signal DQS32 by the time interval GR2 until the time point TR22 in response to the rising edge RDE31. The time interval GR2 may be a propagation delay used to capture the data DR3, marked to be DR3E, of the data bus signal DQ3 into the signal DAR31.

In an embodiment, when the specific rising edge of the data strobe signal DQS3 is coming in earlier than the rising edge RC32, i.e., when the data strobe signal DQS3 is the signal DQS32, the data DR3, marked to be DR3E-RDE31, of the signal DAR31 is latched into the signal DAR32 at the time point TR31 lagged behind the rising edge RC32 of the clock signal CLK3 by the time interval GR3 until the time point TR32 in response to the rising edge RC32. The time interval GR3 may be a propagation delay used to capture the data DR3, marked to be DR3E-RDE31, of the signal DAR31 into the signal DAR32. When the specific rising edge, e.g. RDE31, of the data strobe signal DQS3 is coming in earlier than the rising edge RC32, the data DR3, marked to be DR3E-RDE31-RC32, of the signal DAR32 is relayed to the memory array 301. When the specific rising edge, e.g. RDL31, of the data strobe signal DQS3 is coming in later than or in phase with the rising edge RC32, the data DR3, e.g. marked to be DR3L-RDL31, of the signal DAR31 is relayed to the memory array 301.

In an embodiment, the time points TR11 and TR12 have the duration HR31 being one clock cycle of the clock signal CLK3. The time points TR21 and TR22 have the duration HR32 being one clock cycle of the clock signal CLK3. The time points TR31 and TR32 have the duration HR33 being one clock cycle of the clock signal CLK3. The data DR3 is caused to be valid in the data valid window QR3 being a time interval between the time points TR11 and TR32. In an embodiment, the internal clock signal ICLK3 is produced in response to the clock signal CLK3, wherein the data DR3 is seen in the data valid window QR3 by the internal clock signal ICLK3. In an embodiment, the time intervals GR1, GR2 and GR3 have a same time length, and the data valid window QR3 lasts a ¾ clock cycle of the clock signal CLK3.

Comparing the embodiment in FIG. 3 with the conventional scheme in FIG. 1, the data valid window QR3 of the data DR3 will increase from the ½ clock cycle to a ¾ clock cycle of the clock signal CLK3; i.e. the data valid window QR3 is improved by an additional timing margin of a ¼ clock cycle, which causes the memory device employing the scheme in FIG. 3 to work better with wider PVT variations.

Figure 4:
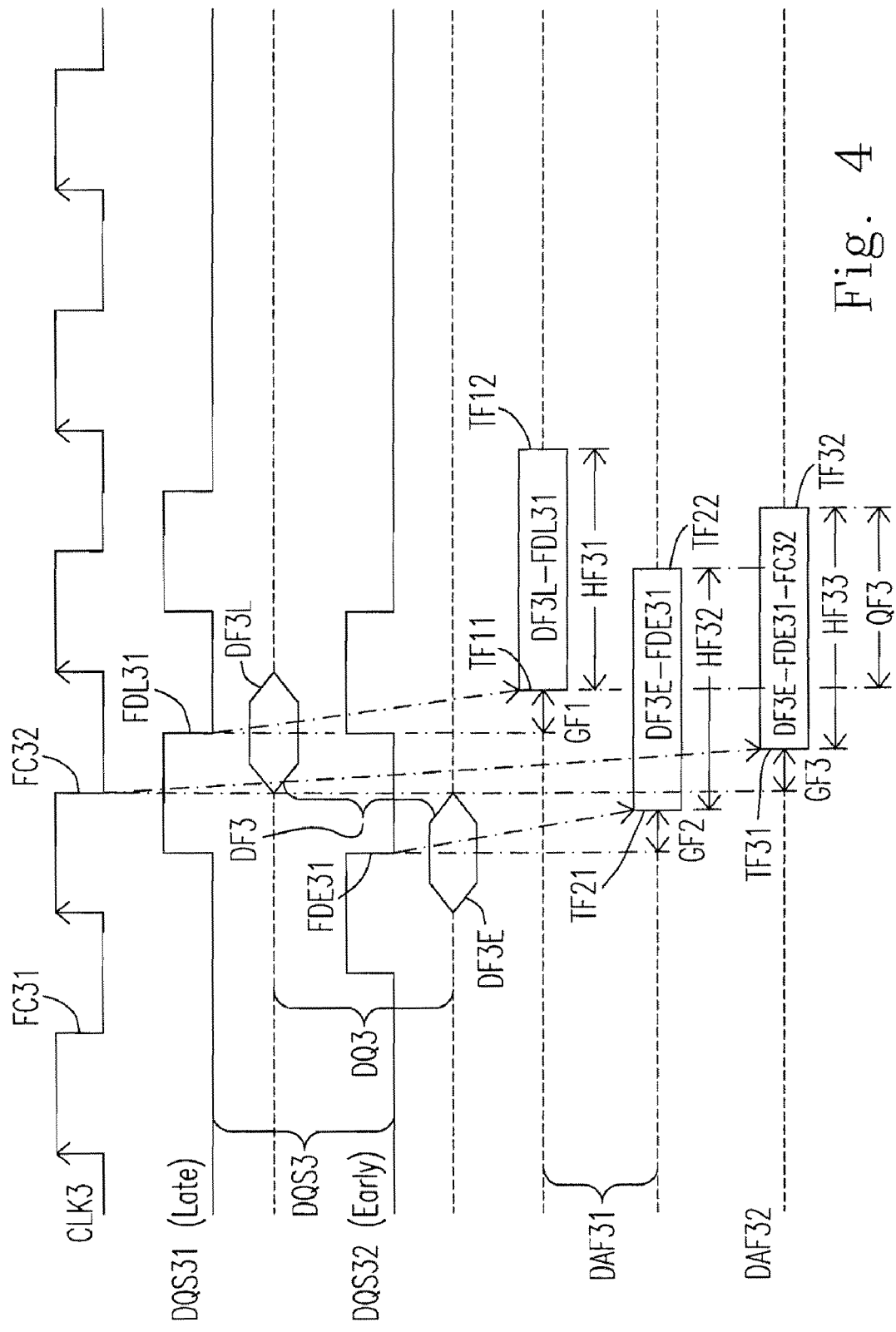
FIG. 4 is a schematic diagram showing a scheme for writing data to the memory array according to the second embodiment of the present invention.

Please refer to FIG. 4, which is the schematic diagram showing the scheme for writing the data DF3 to the memory array 301 according to the second embodiment of the present invention. FIG. 4 shows waveforms including the clock signal CLK3, the data strobe signal DQS3, the data bus signal DQ3, the signal DAF31, and the signal DAF32.

Figure 2:
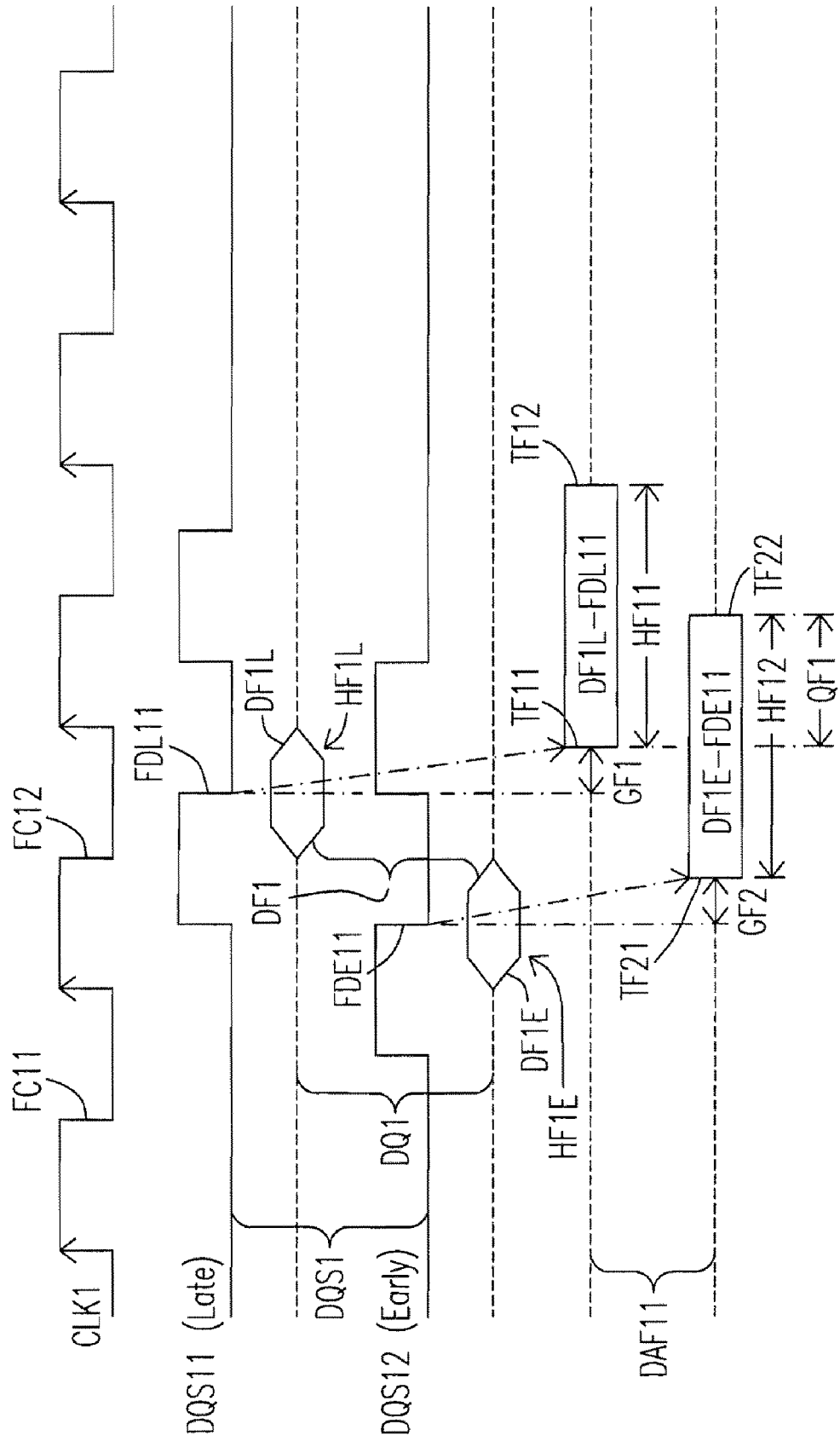
FIG. 2 is a schematic diagram showing the second conventional scheme for writing data to the DDR SDRAM array.

Comparing the embodiment in FIG. 4 with the conventional scheme in FIG. 2, most functions and operation principles of the schemes are similar or the same, so that the descriptions for the portion of the same or the similar are omitted, wherein the clock signal CLK3, the falling edge FC31, the falling edge FC32, the data strobe signal DQS3, the signal DQS31, the falling edge FDL31, the signal DQS32, the falling edge FDE31, the data bus signal DQ3, the data DF3, the data DF3L, the data DF3E, the signal DAF31, the data DF3L-FDL31, the time interval GF1, the time point TF11, the time point TF12, the duration HF31, the data DF3E-FDE31, the time interval GF2, the time point TF21, the time point TF22 and the duration HF32 in FIG. 4 correspond to the clock signal CLK1, the falling edge FC11, the falling edge FC12, the data strobe signal DQS1, the signal DQS11, the falling edge FDL11, the signal DQS12, the falling edge FDE11, the data bus signal DQ1, the data DF1, the data DF1L, the data DF1E, the signal DAF11, the data DF1L-FDL11, the time interval GF1, the time point TF11, the time point TF12, the duration HF11, the data DF1E-FDE11, the time interval GF2, the time point TF21, the time point TF22 and the duration HF12 in FIG. 2, respectively.

In an embodiment in FIG. 4, the data strobe signal DQS3 has a specific falling edge, e.g. FDL31 or FDE31, corresponding to the falling edge FC32 of the clock signal CLK3. The falling edge FC32 is used to relay the data DF3 corresponding to the specific falling edge, e.g. FDE31, of the data strobe signal DQS3 if the specific falling edge, e.g. FDE31, of the data strobe signal DQS3 is coming in earlier than the falling edge FC32 of the clock signal CLK3. In an embodiment, whether the specific falling edge, e.g. FDL31 or FDE31, of the data strobe signal DQS3 is coming in earlier than the falling edge FC32 is detected before the falling edge FC32 is used to relay the data DF3 to the memory array 301.

Based on DDR/DDR2/DDR3 JEDEC timing specification, the falling edge FC32 and the specific falling edge, e.g. FDL31 or FDE31, of the data strobe signal DQS3 have a first timing difference in a range from −25% to 25% of one clock cycle of the clock signal CLK3. In an embodiment, the signal DAF31 is produced in response to the data strobe signal DQS3 and the data bus signal DQ3. The signal DAF32 is produced in response to the clock signal CLK1 and the signal DAF31. The data DF3 of the data bus signal DQ3 is latched into the signal DAF31 at a first time point lagged behind the specific falling edge, e.g. FDL31 or FDE31, of the data strobe signal DQS3 by a first time interval until a second time point in response to the specific falling edge, e.g. FDL31 or FDE31, of the data strobe signal DQS3.

For instance, when the first timing difference is 25% of one clock cycle of the clock signal, i.e., when the data strobe signal DQS3 is the signal DQS31, the data DF3, marked to be DF3L, of the data bus signal DQ3 is latched into the signal DAF31 at the time point TF11 lagged behind the falling edge FDL31 of the signal DQS31 by the time interval GF1 until the time point TF12 in response to the falling edge FDL31. The time interval GF1 may be a propagation delay used to capture the data DF3, marked to be DF3L, of the data bus signal DQ3 into the signal DAF31. For instance, when the specific falling edge of the data strobe signal DQS3 is coming in earlier than the falling edge FC32, i.e., when the data strobe signal DQS3 is the signal DQS32, the data DF3, marked to be DF3E, of the data bus signal DQ3 is latched into the signal DAF31 at the time point TF21 lagged behind the falling edge FDE31 of the signal DQS32 by the time interval GF2 until the time point TF22 in response to the falling edge FDE31. The time interval GF2 may be a propagation delay used to capture the data DF3, marked to be DF3E, of the data bus signal DQ3 into the signal DAF31.

In an embodiment, when the specific falling edge of the data strobe signal DQS3 is coming in earlier than the falling edge FC32, i.e., when the data strobe signal DQS3 is the signal DQS32, the data DF3, marked to be DF3E-FDE31, of the signal DAF31 is latched into the signal DAF32 at the time point TF31 lagged behind the falling edge FC32 of the clock signal CLK3 by the time interval GF3 until the time point TF32 in response to the falling edge FC32. The time interval GF3 may be a propagation delay used to capture the data DF3, marked to be DF3E-FDE31, of the signal DAF31 into the signal DAF32. When the specific falling edge, e.g. FDE31, of the data strobe signal DQS3 is coming in earlier than the falling edge FC32, the data DF3, marked to be DF3E-FDE31-FC32, of the signal DAF32 is relayed to the memory array 301. When the specific falling edge, e.g. FDL31, of the data strobe signal DQS3 is coming in later than or in phase with the falling edge FC32, the data DF3, e.g. marked to be DF3L-FDL31, of the signal DAF31 is relayed to the memory array 301.

In an embodiment, the time points TF11 and TF12 have the duration HF31 being one clock cycle of the clock signal CLK3. The time points TF21 and TF22 have the duration HF32 being one clock cycle of the clock signal CLK3. The time points TF31 and TF32 have the duration HF33 being one clock cycle of the clock signal CLK3. The data DF3 is caused to be valid in the data valid window QF3 being a time interval between the time points TF11 and TF32. In an embodiment, the data DF3 is seen in the data valid window QF3 by the internal clock signal ICLK3. In an embodiment, the time intervals GF1, GF2 and GF3 have a same time length, and the data valid window QF3 lasts a ¾ clock cycle of the clock signal CLK3.

Comparing the embodiment in FIG. 4 with the conventional scheme in FIG. 2, the data valid window QF3 of the data DF3 will increase from the ½ clock cycle to a ¾ clock cycle of the clock signal CLK3; i.e. the data valid window QF3 is improved by an additional timing margin of a ¼ clock cycle, which causes the memory device employing the scheme in FIG. 4 to work better with wider PVT variations.

In an embodiment, a method is provided for writing data, e.g. DR3, to the memory array 301 operating in synchronization with the clock signal CLK3 having a transition edge, e.g. RC32, according to FIG. 3. A data strobe signal, e.g. DQS32, having a transition edge, e.g. RDE31, corresponding to the transition edge, e.g. RC32, of the clock signal CLK3 is provided. The transition edge, e.g. RC32, of the clock signal CLK3 is used to relay the data, e.g. DR3, corresponding to the transition edge, e.g. RDE31, of the data strobe signal, e.g. DQS32, if the transition edge, e.g. RDE31, of the data strobe signal, e.g. DQS32, is coming in earlier than the transition edge, e.g. RC32, of the clock signal CLK3.

In an embodiment, the transition edge of the clock signal CLK3 is the rising edge RC32, and the transition edge of the data strobe signal DQS32 is the rising edge RDE31. In an embodiment, the transition edge of the clock signal CLK3 is the falling edge FC32, and the transition edge of the data strobe signal DQS32 is the falling edge FDE31.

In an embodiment, a method is provided for writing data, e.g. DR3, to a memory. In order to increase the timing margin for writing the data, e.g. DR3, the clock signal CLK3 and the data strobe signal DQS3 are received. Whether the data strobe signal DQS3 is coming in earlier than the clock signal CLK3 is detected. If the data strobe signal DQS3 is coming in earlier than the clock signal CLK3, the data, e.g. DR3, is relayed based on the clock signal CLK3 for writing the data, e.g. DR3, to the memory.

While the invention has been described in terms of what is presently considered to be the most practical and preferred embodiments, it is to be understood that the invention needs not be limited to the disclosed embodiments. On the contrary, it is intended to cover various modifications and similar arrangements included within the spirit and scope of the appended claims, which are to be accorded with the broadest interpretation so as to encompass all such modifications and similar structures.

What is claimed is:

1. A method for writing data to a memory array operating in synchronization with a clock signal having a first transition edge, comprising steps of:
    (a) providing a data strobe signal having a second transition edge corresponding to the first transition edge of the clock signal;
    (b) providing a first signal and a second signal;
    (c) latching the data into the first signal in response to the second transition edge of the data strobe signal; and
    (d) using the first transition edge of the clock signal to relay the data corresponding to the second transition edge of the data strobe signal if the second transition edge of the data strobe signal is coming in earlier than the first transition edge of the clock signal, wherein:
    the clock signal has a rising edge and a falling edge, and the data strobe signal has a rising edge and a falling edge respectively corresponding to the rising and the falling edges of the clock signal;
    the first transition edge of the clock signal is one of the rising and the falling edges of the clock signal; and
    the step (d) comprises a sub-step of latching the data of the first signal into the second signal at a first time point lagged behind the first transition edge of the clock signal by a first time interval until a second time point in response to the first transition edge of the clock signal when the second transition edge of the data strobe signal is coming in earlier than the first transition edge of the clock signal.

2. A method according to claim 1, further comprising a step of detecting whether the second transition edge of the data strobe signal is coming in earlier than the first transition edge of the clock signal between the step (a) and the step (b).

3. A method according to claim 1, wherein the first transition edge of the clock signal and the second transition edge of the data strobe signal have a first timing difference in a range from −25% to 25% of one clock cycle of the clock signal.

4. A method according to claim 3, in front of the step (d), further comprising a step of:
providing a data bus signal carrying the data in a first duration corresponding to the second transition edge of the data strobe signal,
wherein the data of the data bus signal is latched into the first signal at a third time point lagged behind the second transition edge of the data strobe signal by a second time interval until a fourth time point.

5. A method according to claim 4, wherein the second time interval is a first propagation delay used to capture the data of the data bus signal into the first signal, and the first time interval is a second propagation delay used to capture the data of the first signal into the second signal.

6. A method according to claim 4, wherein when the first timing difference is 25% of one clock cycle of the clock signal, the third time point, the fourth time point and the second time interval are respectively a fifth time point, a sixth time point and a third time interval.

7. A method according to claim 6, wherein the first and the second time points have a second duration being one clock cycle of the clock signal, the third and the fourth time points have a third duration being one clock cycle of the clock signal, and the fifth and the sixth time points have a fourth duration being one clock cycle of the clock signal.

8. A method according to claim 7, wherein the data is caused to be valid in a data valid window being a fourth time interval between the fifth and the second time points.

9. A method according to claim 8, wherein the first, the second and the third time intervals have a same time length, and the data valid window lasts a ¾ clock cycle of the clock signal.

10. A method according to claim 8, further comprising a step of producing an internal clock signal in response to the clock signal, wherein the data is seen in the data valid window by the internal clock signal.

11. A method according to claim 4, wherein the data of the second signal is relayed to the memory array.

12. A method according to claim 1, wherein the memory array is a double data rate synchronous dynamic random access memory (DDR SDRAM) array.

13. A method for writing data to a memory array operating in synchronization with a clock signal having a first transition edge, comprising steps of:
(a) providing a data strobe signal having a second transition edge corresponding to the first transition edge of the clock signal; and
(b) using the first transition edge of the clock signal to relay the data corresponding to the second transition edge of the data strobe signal if the second transition edge of the data strobe signal is coming in earlier than the first transition edge of the clock signal, wherein:
the first transition edge of the clock signal and the second transition edge of the data strobe signal have a first timing difference in a range from −25% to 25% of one clock cycle of the clock signal; and
the data is caused to be valid in a data valid window lasting a ¾ clock cycle of the clock signal.

14. A method according to claim 13, wherein the first transition edge of the clock signal is a rising edge of the clock signal, and the second transition edge of the data strobe signal is a rising edge of the data strobe signal.

15. A method according to claim 13, wherein the first transition edge of the clock signal is a falling edge of the clock signal, and the second transition edge of the data strobe signal is a falling edge of the data strobe signal.

16. A method according to claim 13, wherein the memory array is a dynamic random access memory (DRAM) array.

17. A method for writing data to a memory, comprising steps of:
(a) providing a clock signal having a first transition edge;
(b) receiving a data strobe signal having a second transition edge corresponding to the first transition edge of the clock signal;
(c) providing a first signal and a second signal;
(d) latching the data into the first signal in response to the second transition edge of the data strobe signal; and
(e) relaying the data based on the clock signal if the data strobe signal is coming in earlier than the clock signal, wherein the step (e) comprises a sub-step of latching the data of the first signal into the second signal at a first time point lagged behind the first transition edge of the clock signal by a first time interval until a second time point in response to the first transition edge of the clock signal when the second transition edge of the data strobe signal is coming in earlier than the first transition edge of the clock signal.

* * * * *